United States Patent

Heuner et al.

[15] 3,702,943

[45] Nov. 14, 1972

[54] FIELD-EFFECT TRANSISTOR CIRCUIT FOR DETECTING CHANGES IN VOLTAGE LEVEL

[72] Inventors: Robert Charles Heuner, Somerset; Richard Plumb Fillmore, Union, both of N.J.

[73] Assignee: RCA Corporation

[22] Filed: Nov. 5, 1971

[21] Appl. No.: 196,018

[52] U.S. Cl. ....................307/235, 307/251, 307/304

[51] Int. Cl. ..................................................H03k 5/20

[58] Field of Search......307/205, 235, 251, 279, 304; 317/235

[56] References Cited

UNITED STATES PATENTS

| | | | |
|---|---|---|---|
| 3,444,397 | 5/1969 | Lym | 307/304 |
| 3,512,012 | 5/1970 | Kosowsky et al. | 307/304 X |
| 3,657,575 | 4/1972 | Taniguchi et al. | 307/251 X |
| 3,573,505 | 4/1971 | Gaensslen | 307/304 X |
| 3,601,630 | 8/1971 | Redwine | 307/304 X |

*Primary Examiner*—Herman Karl Saalbach
*Assistant Examiner*—R. C. Woodbridge
*Attorney*—H. Christoffersen

[57] ABSTRACT

Two field-effect transistors interconnected in such a way that the output voltage produced by the first, which is a function of its voltage threshold, controls the conductivity of the second. One transistor may be reverse biased source-to-substrate to maintain its threshold voltage higher than that of the other. A small change in voltage level may be detected by this circuit by causing that change concurrently to reduce the source-to-substrate reverse bias of the first transistor and to reverse bias the source-to-substrate of the second transistor.

14 Claims, 4 Drawing Figures

INVENTOR.
ROBERT C. HEUNER &
RICHARD P. FILLMORE
BY H. Christoffersen
ATTORNEY

FIELD-EFFECT TRANSISTOR CIRCUIT FOR DETECTING CHANGES IN VOLTAGE LEVEL

STATEMENT

This invention was made in the course of or under a contract or subcontract thereunder with the Department of the Army.

BACKGROUND OF THE INVENTION

The invention relates to the amplification or detection of signals whose amplitude is equal to or less than the threshold voltage level of the amplifying or detecting circuit.

A problem exists in the amplification or detection of small signals because the input stage of the amplifying or detecting means normally includes a transistor which does not conduct until its threshold voltage ($V_T$) is exceeded. This problem is normally overcome by applying a forward bias comprising a direct current (DC) potential to the input stage in order to raise the level of the input above the threshold level. But now, in order to prevent the forward bias potential from affecting the signal, the signal must be alternating current (AC) coupled to the input stage. This usually requires the use of a capacitor which is disadvantageous on two grounds. First, in integrated circuits, capacitors are difficult to manufacture and take up much valuable area. Second, capacitors limit the frequency response of the amplifying or detecting means. Thus, if the input signal is a low frequency signal, the coupling capacitor must be made large in order to pass the signal.

The magnitude of the problem is best illustrated by noting that insulated-gate field-effect transistors (IGFETs) may, for example, have a $V_T$ which is typically 1.5 volts but which may have a minimum value of 0.5 volts and a maximum value of 4.0 volts. Therefore, the sensing of signals whose amplitude is below the threshold levels of these transistors and which for system consideration must be direct current connected to these transistors is very difficult.

SUMMARY OF THE INVENTION

First and second devices are interconnected in such a way that a voltage at one device which may have a value which is a function of its voltage threshold level, controls the conductivity of the other device. The voltage threshold level of one device normally is maintained at a higher value than that of the other. The voltage to be detected is employed concurrently to reduce the threshold level of the one device and to increase the threshold level of the other device.

BRIEF DESCRIPTION OF THE DRAWINGS

In the accompanying drawings, like reference characteristics denote like components.

DETAILED DESCRIPTION OF THE INVENTION

Figure 1A:
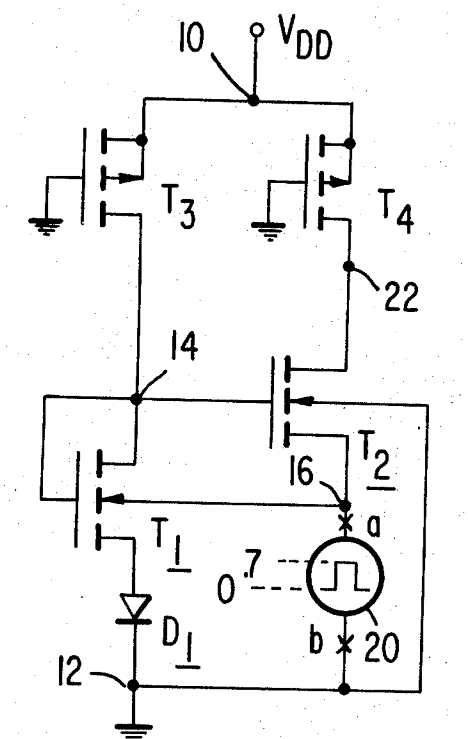
FIG. 1A is a schematic drawing of a circuit embodying the invention.

In the circuit of FIG. 1, a source of operating potential $V_{DD}$, which may, for example, be +10 volts may be connected to terminal 10 and terminal 12 may be connected to ground. Transistor T1 is connected at its substrate to a signal input point 16 at its gate and drain to junction point 14 and at its source to a constant voltage device such as diode D1. The latter is connected at its anode to the source of transistor T1 and at its cathode to ground terminal 12. Transistor T2 is connected at its source to signal input point 16, at its substrate to terminal 12, at its gate to the drain of transistor T1, and at its drain to output terminal 22. A signal source 20 is connected between signal input point 16 and terminal 12.

Transistor T4 is connected at its source and substrate to terminal 10, at its gate to ground potential, and at its drain to terminal 22. Transistor T3 is connected at its source and substrate to terminal 10 and at its gate to ground potential. So connected, transistors T3 and T4 function as load resistors providing current paths through their source-drain paths, respectively.

To simplify the explanation of the operation of the circuit which follows, the effect of applying a reverse potential between the source and substrate of an insulated-gate field-effect transistor is reviewed. First, the threshold voltage ($V_T$) of a transistor may be defined as the value of gate-to-source potential ($V_{GS}$) that must be applied to turn the transistor "on." Theoretically, $V_T$ is defined for zero drain-to-source current. In practice, $V_T$ is specified at extremely low drain-source currents and for the condition when the source and the substrate of the transistor are at the same potential.

The $V_T$ of a transistor varies as a function of the source and substrate potentials. The $V_T$ increases when the source is reverse biased with respect to the substrate and decreases when the source is forward biased with respect to the substrate. As a practical matter, the source is not normally forward biased with respect to the substrate since this causes current to flow through the substrate-source junction.

The gate-to-source potential ($V_{GS}$) is also a function of the drain-source current ($I_{DS}$) level, increasing with increasing $I_{DS}$. However, this is a second order effect in comparison with the source-substrate bias effect. Therefore, to facilitate the explanation, the current dependence of $V_{GS}$ will be ignored with the discussion of FIGS. 1 and 2. To a first approximation, the dynamic threshold voltage $V_T$ of an N-type transistor may be expressed as follows:

$$V_T = V_{TO} + K_S\,(V_{source} - V_{substrate}) \qquad \text{(Eq. 1)}$$

where: $V_{TO}$ is the $V_T$ for the condition when the source potential ($V_S$) equals the substrate potential ($V_{SS}$); and $K_S$ is a constant expressed in volts per volt which is a function of the manufacturing process. Furthermore, it will be assumed that $V_{TO}$ is the same for transistors T1 and T2.

The operation of the circuit of FIG. 1 will now be explained for two extreme conditions of input signals. First, assume that the signal produced by signal source 20 is equal to zero volts. For this signal condition, the potential at junction point 16 is zero volts. The source and the substrate of transistor T2 are at the same potential (i.e., $V_{S2} = V_{SS2} = 0$ volts) and the $V_T$ of transistor T2 ($V_{T2}$) is equal to $V_{TO}$. The potential applied to the gate of transistor T2 ($V_{G2}$), that is, the potential at junction point 14, is equal to the sum of the threshold voltage $V_T$ of transistor T1 ($V_{T1}$) plus the forward drop ($V_F$) of diode D1 ($V_{G2} = V_{T1} + V_F$).

Transistor T3, which is of P-conductivity type, is turned on ($V_{DD}$ volts are applied to its source and ground potential to its gate) providing a bias current which flows through the source-drain path of transistor T1 and through diode D1. The $V_F$ of diode D1 is at a relatively constant DC level which may, for example, be assumed to be 0.7 volts. This places the source of transistor T1 at $V_F$ volts while its substrate is at zero volts. The source of transistor T1 is thus reverse biased with respect to its substrate and $V_{T1}$ is equal to $V_{TO}$ plus $K_S$ $V_F$. The potential at junction point 14 ($V_{G2}$) is, therefore, equal to $V_{TO} + K_S V_F + V_F$. Since $V_{T2}$ is equal to $V_{TO}$ and since $V_{S2}$ is zero volts, the potential is applied to its gate ($V_{G2}$) exceeds the required level to turn it on by $K_S V_F + V_F$ volts. Assuming $K_S$ to be equal to 1 volt per volt, $V_{T2}$ is exceeded by $2 \times V_F$ volts. For this condition, it is therefore evident that the potential applied between the gate and source of transistor T2 is considerably greater than its $V_T$ which ensures that transistor T2 is fully turned on. With transistor T2 conducting, output terminal 22 is coupled through the source-drain path of T2 to a low (zero volts) value of potential.

Summarizing, when source 20 produces an output of zero volts; both transistors T1 and T2 conduct. Transistor T2 is unbiased source-to-substrate (the source and substrate are both at the same potential, namely, zero volts) and the voltage present at terminal 14 is greater than its threshold voltage. Transistor T1 is reverse biased source-to-substrate by roughly 0.7 volts—the voltage drop across the diode D1. However, current passing through load transistor T3 does flow through transistor T1 and the voltage at 14, which is also the voltage at the gate electrode of transistor T1 is greater than the increased threshold voltage $V_{T1}$ of transistor T1.

Now, assume that the signal produced by source 20 goes high (e.g., 0.7 volts). This signal is applied to the circuit in a sense to counteract the reverse source-to-substrate bias on T1 produced by diode D1 and in a sense to reverse bias the source-to-substrate of transistor T2. The source 20 places the substrate of transistor T1 at 0.7 volts and its source electrode also is at 0.7 volts so that zero bias exists between the source electrode and substrate of transistor T1. On the other hand, the source 20 applies a reverse potential of 0.7 volts between the source and substrate of transistor T2 and this increases the effective threshold of the transistor T2 above its former value. $V_{T2}$ is increased to $V_{TO} + K_S$ (0.7). Concurrently, the effective threshold of transistor T1 is decreased and equals $V_{TO}$ since its source and substrate are now at the same potential (i.e., $V_{S1} = V_{SS1} = 0.7$ volts—$V_F$ is assumed to be equal to 0.7 volts). $V_{G2}$ is still equal to $V_{T1} + V_F$, but $V_{T1}$ is now equal to $V_{TO}$. The potential level required to turn transistor T2 on is equal to the sum of $V_{S2}$ and $V_{T2}$. That is $V_{S2} + V_{T2}$ equals 0.7 volts $+[V_{TO} + K_S(0.7)]$volts. Since $V_{G2}$ is set at $V_{TO} + 0.7$ volts, the $V_{GS}$ of transistor $T_2$ is reverse biased by $K_S$ (0.7 volts). Transistor T2 is, therefore, cut off. As a result, the potential at terminal 22 goes high, rising towards $+V_{DD}$ through the source-drain path of transistor T4.

Summarizing the above, a small change in signal level may be detected by the circuit of FIG. 1, by applying that signal in a sense to decrease the source-to-substrate bias on transistor T1 and concurrently to apply a reverse bias source-to-substrate potential to transistor T2. The decrease in source-to-substrate bias on T1 decreases its threshold voltage $V_{T1}$. This decreases the voltage at 14 as the value of this voltage is a function of $V_{T1}$ ($V_{14} = V_{G2} = V_{T1} + V_F$ but $V_{T1}$ has reduced from ($V_{TO} + K_S V_F$) to $V_{TO}$). Thus the "signal" applied to the gate of transistor T2 becomes less positive, causing the conduction through T2 to decrease. At the same time, the threshold voltage $V_{T2}$ of transistor T2 increases because of the reverse bias source-to-substrate voltage applied by source 20. When the two cross, that is, when the voltage at 14 reduces to a value lower than $V_{T2}$, transistor T2 abruptly cuts off.

This push-pull arrangement (increasing the $V_T$ of one transistor while decreasing the $V_T$ of the other) ensures the production of output pulses at terminal 22 having relatively sharp transitions in response to low level input signals which may have much slower transitions.

Another important feature of the circuit is that to a first approximation, the point at which transistor T2 switches from one state (e.g., conduction) to the other state (e.g., non-conduction) is virtually independent of the threshold of the transistors. The switching point of transistor T2, occurs when the potential applied to its gate ($V_{G2}$) equals the sum of $V_{T2}$ and the potential applied at its source ($V_{S2}$). $V_{G2}$ may be expressed as:

$$V_{G2} = V_F + V_{TO} + K_S (V_F - V_{IN}) \qquad \text{(Eq. 2)}$$

where: $V_{IN}$ is the potential applied to the substrate of transistor T1 and the source of T2 at junction point 16.

The sum of $V_T$ and $V_{S2}$ for transistor T2 may be expressed as:

$$V_{T2} + V_{S2} = V_{TO} + K_S V_{IN} + V_{IN} \qquad \text{(Eq. 3)}$$

Setting equation 2 equal to equation 3 and solving for $V_{IN}$ in terms of $V_F$ yields:

$$V_{IN} = V_F (1 + K_S)/(1 + 2K_S) \qquad \text{(Eq. 4)}$$

The point at which transistor T2 switches is, therefore, a function of $V_F$ and $K_S$. Where, for example, $K_S =$ 1 volts/volt transistor T2 changes conduction state (switches) when the input ($V_{IN}$) is equal to ⅔ $V_F$.

$V_F$ is produced in FIG. 1 by use of a single diode D1. Alternately, this potential could be produced by more than one diode, by a battery (see FIG. 2) or by use of a voltage divider coupled to $V_{DD}$ or to some other source of potential. The potential applied to the source of transistor T1 could then be any selected value within a range limited by the operating levels ($V_{DD}$ and ground). Selecting the source potential of transistor T1 to be higher than the maximum input signal ensures that the substrate potential of transistor T1 does not go positive with respect to the source (actually, the input can be higher by one diode drop). This prevents current flow through the substrate-source region which then appears as essentially a forward biased diode junction.

Another feature of this circuit is that it permits a low level input signal to be directly coupled to the detector circuit. This obviates the need for coupling capacitors which level shift the signal, which limit the frequency response of the circuit and which are undesirable in integrated circuits.

While the circuit of FIG. 1A has been discussed in terms of sensing a small change in the positive sense in a signal produced by source 20 it can, of course, be used in the opposite way too. In other words, in the quiescent condition of the circuit, transistor T2 may be off and transistor T1 on and terminal 22 at a voltage equal to $V_{DD}$. If now the source 20 applies a negative-going signal to terminal 16, that is, a signal in a sense to increase the source-to-substrate bias of transistor T1 and to decrease the source-to-substrate bias of transistor T2, transistor T2 can be driven into conduction. Conduction will occur when the voltage at terminal 14 increases to a value greater than the voltage threshold of transistor T2 (which voltage threshold is being reduced concurrently with the increase of voltage at 14). When transistor T2 starts to conduct, the voltage at terminal 22 sharply reduces from $V_{DD}$ to a substantially lower value which may be zero volts or close to it.

While in the circuit of FIG. 1A transistors T3 and T4 are employed as load elements, it is to be appreciated that load resistors may be used instead. Similarly, as already indicated, means other than a diode are possible for producing the source-to-substrate reverse bias.

Figure 1B:
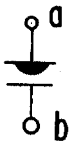
FIG. 1B is a schematic representation of an E-CELL INTEGRATOR which may be used in another circuit according to this invention.

The circuit illustrated in FIG. 1A modified in the manner shown in FIG. 1B, is useful for producing an output signal after a given interval of time. The device shown in FIG. 1B, which replaces the signal source 20 of FIG. 1A, is a so-called E-CELL integrator described, for example, in Bulletin 103 published by the Bisset-Berman Corporation. This circuit element slowly charges in response to a small current applied thereto and when the charge reaches a certain value, the voltage across the device abruptly changes from say some value such as 0.3 volts to 0.9 volts.

In the operation of the circuit modified as indicated above, the transistor T4 may be designed to permit current to be conducted at a very low level. The E-CELL integrator initially is completely discharged. The transistors T1 and T2 both conduct, transistor T2 conducting at the relatively low current level supplied by load transistor T4. The E-CELL integrator gradually accumulates charge over a period of hours or possibly even days, depending upon the circuit design. When a critical value of charge is reached, that is, when the current bias flowed for the determined in advance time interval, the transistor T2 cuts off for the same reasons as already discussed and an abrupt, positive-going output signal is produced at output terminal 22. This signal may be employed for ringing an alarm, tripping a relay or in many other ways.

Figure 2:
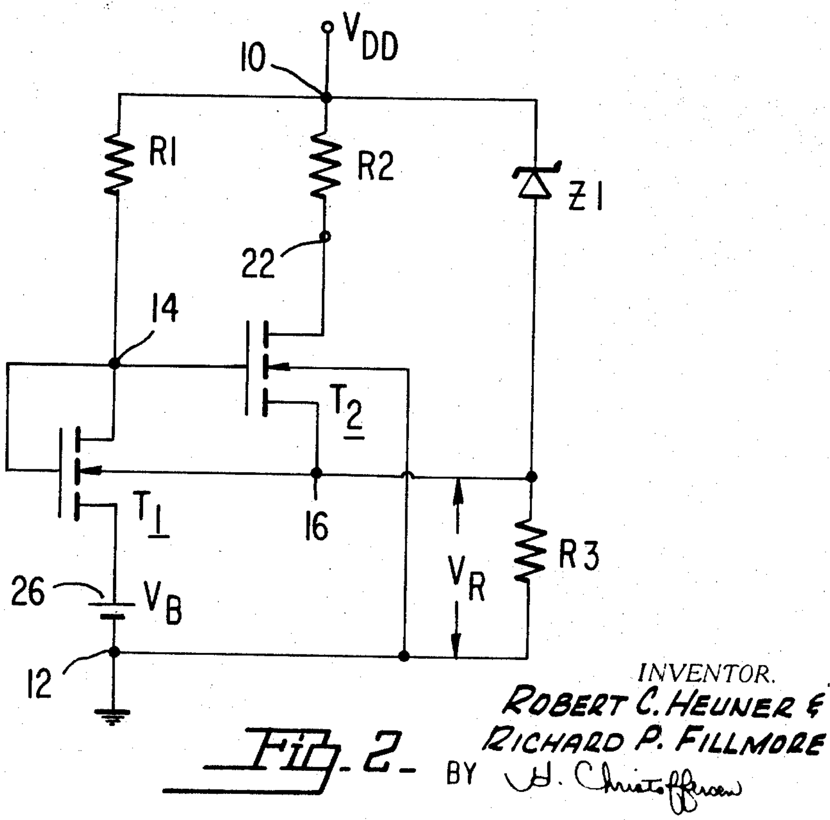
FIG. 2 is a schematic drawing of another circuit embodying the invention.

The circuit of FIG. 2 illustrates the use of a circuit, embodying the invention, to sense a slowly and linearly varying potential level. In this instance, a low output produced at terminal 22 indicates when $V_{DD}$ falls below a preselected level. However, the circuit could as well be used in the opposite sense, that is, to indicate a rise in $V_{DD}$ above a preselected level. The circuit of FIG. 2 differs from that of FIG. 1 in that the diode D1 is replaced by a battery 26 of potential $V_B$ and in that the transistors T3 and T4 are replaced by resistors R1 and R2, respectively. In addition, the signal source is replaced by the combination of Zener diode Z1 connected between terminals 10 and 16 and a resistor R3 connected between terminals 16 and 12.

The potential at input point 16 denoted by $V_R$ is equal to $V_{DD} - V_Z$ where $V_Z$ is the Zener diode voltage drop. Thus $V_{S2} = V_R$ and is also equal to $V_{DD} - V_Z$ and $V_{T2}$ is equal to $V_{TO} + K_S V_R$. The gate potential of transistor T2 is equal to:

$$V_{G2} = V_{TO} + K_S(V_B - V_R) + V_B \qquad \text{(Eq. 4)}$$

Transistor T2 switches from the normally non-conducting state to the conducting state when its source potential plus its $V_T$ equals its gate potential. That is, when $$V_{TO} + K_S(V_B - V_R) + V_B = V_{TO} + K_S V_R + V_R \qquad \text{(Eq. 5)}$$

The potential $V_{DD}$ is the variable in this case and the detection point, that is, the point at which transistor T2 switches occurs when $V_{DD}$ is equal to:

$$V_Z + \frac{(1+K_S)}{(1+2K_S)} V_B \qquad \text{(Eq. 6)}$$

Thus, the point at which the circuit switches and a signal is produced at terminal 22 is set by selecting an appropriate $V_Z$ and $V_B$ for a given $K_S$.

Figure 3:
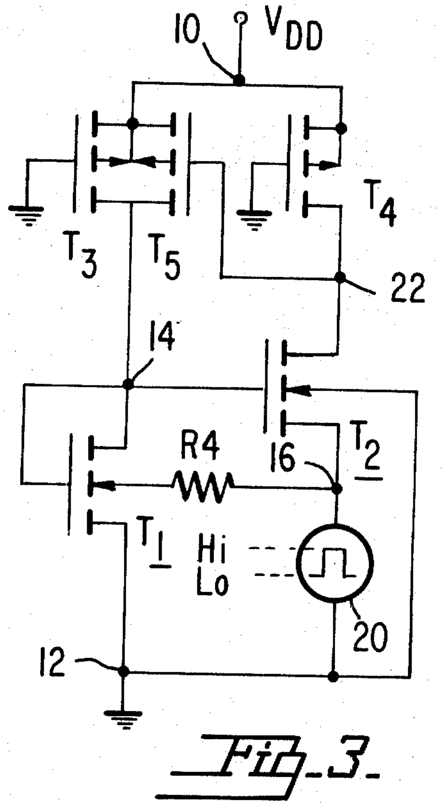
FIG. 3 is a schematic drawing of still another circuit embodying the invention.

In the circuit of FIG. 3, the source of transistor T1 is directly connected to the substrate of transistor T2 at terminal 12. A resistor R4 connected between the source of transistor T2 and the substrate of transistor T1 limits any current flow through the substrate-source region of transistor T1 when the signal goes positive. The source-drain path of a transistor T5 is connected in parallel with that of transistor T3 and the gate of transistor T5 is connected back to the drain of transistor T2 at terminal 22. Transistor T4, as in FIG. 1, provides a source of current into terminal 22.

It was mentioned above that the variations in $V_{GS}$ as a function of $I_{DS}$ was a secondary effect in comparison to the effect of reverse biasing the substrate-to-source potential. However, by making transistors T5 such that its "on" resistance is relatively low in comparison to the on resistance of transistor T3, the current level through transistor T1 may be changed one or more orders of magnitude. Varying the gate-to-source potential by making use of both the substrate bias effect and the drain-to-source current level change offers in some instances certain advantageous features.

Assume that the input signal is initially low (close to zero volts). Transistors T3, T4, and T5 are "on" and the current through transistor T5 which provides the source-drain current of transistor T1 may, for example, be 100 times the current through transistor T2 raising the potential applied to the gate of transistor T2. As a result, transistor T2 is turned on and the signal at junction point 22 is clamped to a low value of potential.

As the input signal rises, the source-to-substrate of transistor T2 is increasingly reverse biased while the source to substrate region of transistor T1 is increasingly forward biased. At some point, transistor T2 cuts off causing its drain potential to rise which in turn causes transistor T5 to cut off. This in turn causes the $I_{DS}$ current through transistor T1 to decrease, further decreasing its gate-to-source potential and in turn the potential applied to the gate of transistor T2, thus speeding the turn off of transistor T2.

A signal source may thus be directly connected between the source and substrate of two transistors in a direction to increase the $V_T$ of one while decreasing the $V_T$ of the other.

In the circuits of FIGS. 1, 2, and 3 the signal source was connected to the N-type transistors. It should, however, be appreciated that P-type transistors could as well be used to detect small signals.

What is claimed is:

1. A circuit for detecting a small change in voltage level comprising, in combination;
   first and second devices interconnected so that the voltage produced by one, whose value is a function of its threshold voltage level, controls the conductivity of the second;
   means normally maintaining the threshold voltage level of one of said devices higher than that of the other; and
   means responsive to a voltage to be detected for concurrently decreasing the higher threshold voltage level of the one device while increasing the lower threshold voltage level of the other device.

2. A circuit as set forth in claim 1 wherein each device comprises a transistor.

3. A circuit as set forth in claim 1 wherein each device comprises a field-effect transistor.

4. A circuit as set forth in claim 3 wherein said means normally maintaining the threshold voltage level of one of said devices higher than that of the other comprises means normally reverse biasing the source to substrate of said one device.

5. A circuit as set forth in claim 1 wherein each device comprises a field-effect transistor having source, gate and drain electrodes and a substrate, said first device being connected gate to drain and to the gate of the second transistor and the substrate of said first device being connected to the source of said second device;
   said means normally maintaining the threshold voltage level of one of said devices higher than that of the other comprising biasing means for reverse biasing for applying a reverse bias between the source electrode and substrate of said first device; and
   said means responsive to a voltage to be detected comprising means for applying a signal in one sense between the substrate and source electrode of the first transistor and in the opposite sense between the substrate and source electrode of the second transistor.

6. A circuit for detecting a small change in voltage level comprising, in combination;
   normally conducting first and second field-effect transistors interconnected so that a voltage developed by the first whose value is a function of its source-to-substrate bias, controls the conductivity of the second;
   means normally reverse biasing the first transistor source-to-substrate; and
   means applying the voltage to be detected to both transistors in a sense to reduce the source-to-substrate bias on the first and to reverse bias the source-to-substrate of the second.

7. The combination comprising:
   first and second transistors, each transistor having a substrate, source and drain electrodes defining the ends of a conduction path within its substrate and a gate electrode;
   means connecting the source of the first transistor and the substrate of the second transistor to a first input point;
   means connecting the substrate of said first transistor to a second input point and means coupling the source of said second transistor to said second input point;
   biasing means, including the gate-to-source path of said second transistor, coupled to the gate of said first transistor for applying a potential thereto which is a function of the threshold voltage of said second transistor; and
   means for applying a signal between said two input points which for one value of signal increases the threshold voltage of said first transistor while concurrently decreasing the threshold voltage of said second transistor and which for another value of signal decreases the threshold voltage of said first transistor while concurrently increasing the threshold voltage of said second transistor.

8. The combination as claimed in claim 7 wherein said transistors are insulated-gate field-effect transistors of the same conductivity type.

9. The combination as claimed in claim 8 wherein said biasing means includes means for direct current connecting the gate and drain of said second transistor to the gate of said first transistor and further includes a source of current connected in series with the source-to-drain path of said second transistor and poled in a direction to bias said second transistor into conduction.

10. The combination as claimed in claim 9 wherein said means coupling the source of said second transistor to said second input point includes a source of relatively constant potential; and wherein said source of constant potential is poled in a direction to reverse bias the source of said second transistor with respect to its substrate.

11. The combination as claimed in claim 10 wherein said source of relatively constant potential includes a diode having one of its anode and cathode coupled to the source of said second transistor and the other of its anode and cathode coupled to said second input point.

12. The combination as claimed in claim 11 further including a source of operating potential coupled between said second input point and a first power terminal;
   wherein said source of current is coupled between said first power terminal and the gate and drain of said second transistor; and
   further including output load means coupled between said first power terminal and the drain of said first transistor.

13. The combination as claimed in claim 12 wherein said source of current includes a single transistor having its source-drain path connected between said first power terminal and the gate-drain of said second transistor; and
   wherein said output load means includes a single transistor having its source-drain path connected between said first power terminal and the drain of said first transistor.

14. The combination comprising:

first and second transistors, each transistor having a substrate, source and drain electrodes defining the ends of a conduction path within its substrate, and a gate electrode;

biasing means, including the gate-to-source paths of one transistor, coupled to the gate of the other transistor for controlling the conductivity of said other transistor as a function of the threshold voltage of said one transistor; and means for applying a signal to be detected, between the source electrodes and substrates of said transistor, which when of one sense increases the reverse bias between the source and substrate of one transistor and concurrently decreases the reverse bias between the source and substrate of the other transistor whereby the threshold voltage of said one transistor is increased and the threshold voltage of said other transistor is decreased and which when of opposite sense decreases the source-to-substrate reverse bias of said one transistor while concurrently increasing the source-to-substrate reverse bias of said other transistor whereby the threshold voltage of said one transistor is decreased and the threshold voltage of said other transistor is increased.

* * * * *